United States Patent
Nishimura

[11] 4,063,118
[45] Dec. 13, 1977

[54] MIS DECODER PROVIDING NON-FLOATING OUTPUTS WITH SHORT ACCESS TIME

[75] Inventor: Kotaro Nishimura, Fuchu, Japan
[73] Assignee: Hitachi, Ltd., Japan
[21] Appl. No.: 689,816
[22] Filed: May 25, 1976
[30] Foreign Application Priority Data
  May 28, 1975 Japan .................................. 50-62867
[51] Int. Cl.² ..................... H03K 19/08; H03K 19/34; G11C 8/00; G11C 15/04
[52] U.S. Cl. ..................................... 307/270; 307/205; 307/215; 307/251; 307/DIG. 5; 365/150; 365/182; 365/203
[58] Field of Search ............... 307/205, 215, 238, 251, 307/269, 270, DIG. 5; 340/173 R

[56] References Cited
U.S. PATENT DOCUMENTS

| | | | |
|---|---|---|---|
| 3,702,926 | 11/1972 | Picciano et al. | 307/205 X |
| 3,778,784 | 12/1973 | Karp et al. | 307/238 X |
| 3,796,893 | 3/1974 | Hoffman et al. | 307/205 |
| 3,906,461 | 9/1975 | Cappon | 340/173 |
| 3,906,464 | 9/1975 | Lattin | 307/DIG. 5 X |
| 3,959,781 | 5/1976 | Mehta et al. | 307/DIG. 5 X |
| 3,962,686 | 6/1976 | Matsue et al. | 340/173 R |
| 3,980,899 | 9/1976 | Shimada et al. | 307/DIG. 5 X |

OTHER PUBLICATIONS

Cox et al., "An FET 4-Phase Dynamic Off-Chip Driver with Polarity Hold", IBM Tech. Discl. Bull.; vol. 17, No. 2, pp. 466-467; 7/1974.

Primary Examiner—John S. Heyman
Assistant Examiner—Larry N. Anagnos
Attorney, Agent, or Firm—Craig & Antonelli

[57] ABSTRACT

In a multiplicity of NAND decoders, each comprises a dynamic ratioless circuit including a capacitor to be charged in response to a precharge pulse, an MOS logic circuit for discharging the capacitor by an address pulse in the non-selection mode, and first and second MOSFETs connected in series between a clock pulse terminal and ground. The first MOSFET conducts in response to the terminal voltage of the capacitor to transmit a clock pulse from its drain and supplies an output to a word line. The terminal voltage of the capacitor in one decoder is applied to the gate of the second MOSFET of another decoder and the word line output of the other decoder is grounded even during the discharging period of the capacitor in the non-selection mode of the other decoder, enabling a synchronous supply of the address and the clock pulses.

7 Claims, 7 Drawing Figures

MIS DECODER PROVIDING NON-FLOATING OUTPUTS WITH SHORT ACCESS TIME

BACKGROUND OF THE INVENTION

1. FIELD OF THE INVENTION

This invention relates to a metal-insulator-semiconductor (MIS) logic circuit and more particularly to a MIS decoder circuit.

2. DESCRIPTION OF THE PRIOR ART

A variety of random access memories (referred to as RAM, herein below) formed in ICs have been developed along with the recent remarkable progresses in microcomputers. A representative example is the Intel 1103 1 kbit MOS dynamic IC memory. The decoder circuit of such a RAM utilizes the dynamic ratioless circuit and is formed of a plurality of address circuits including a NAND type logic circuit.

An example of such a conventional MOS decoder logic circuits will be described referring to FIGS. 1A to 1C.

FIG. 1A shows the circuit structure and FIGS. 1B and 1C show the timing waveforms of an information output operation in the case of the address selection mode.

In this circuit, at first, a first pulse P is applied to the gate of a metal-oxide-semiconductor field effect transistor (MOSFET) $Q_1$. Then, a parasitic capacitor $C_o$ is charged with the voltage $V_{DD}$ (precharge period $t_1$). In the address selection mode, no second pulses A to E are applied to the gates of the MOSFETS $Q_2$ to $Q_6$. Thus, the capacitor $C_o$ remains charged. Here, the first pulse no longer exists and the FET $Q_1$ is turned off. Then, a third pulse CE such as a socalled chip enable signal is applied to the drain of the MOSFET $Q_7$. As a result, a signal of a logic value "1" is derived from a word line WL on the source side of said MOSFET $Q_7$. For discharging the word line, the gate of the MOSFET $Q_8$ is applied with another pulse $\overline{CE}$ to bring it into the "on" state and hence to ground the word line WL.

Next, in the address non-selection mode, at least one second pulse as shown by A to E in FIG. 1B is applied to the gate of at least one MOSFET $Q_2$ (sampling period $t_2$). Therefore, the stored charge in the capacitor $C_o$ is discharged through the one turned-on MOSFET among the MOSFETS $Q_2$ to $Q_6$. At this time, the first pulse has already disappeared. When a third pulse CE is applied to the drain of the MOSFET $Q_7$ (information outputting period $t_3$), a signal of a logic "0" is derived from the word line WL connected to the source of the MOSFET $Q_7$. In this way, the logical result of the MOS logic circuit $Q_2$ to $Q_6$ is stored in and read out from the capacitor $C_o$.

In this way, the decoder circuit using the dynamic drive operates in a time sharing manner: in three periods made up of a charging period ($t_1$), a sampling period ($t_2$) and an information outputting period ($t_3$). The dynamic ratioless circuit used in this circuit is described in Japanese Patent Publication No. 47463/1972 (based on U.S. Ser. No. 523,767 filed on Jan. 28, 1966 and U.S. Ser. No. 10,966 filed on Feb. 11, 1970.) and has such advantages that the power consumption is small, and that there is no need to consider the voltage ratio of the MOSFETS constituting the circuit.

In such a conventional circuit, however, in the address non-selection mode, there is a possibility of generating a signal of a logic "1" on the word line unless the third pulse CE is applied after the charge stored on the capacitor $C_o$ has been completely discharged, as shown in FIG. 1C. Accordingly, there must be a sufficient delay in the input period of the third pulse CE as shown by the dotted line. Therefore, this leads to an elongated access time (FIG. 1C).

For solving these problems, the time constant for discharging the capacitor $C_o$ in the address non-selection mode should preferably be made small. For reducing the time constant, the "on" resistance of all the MOSFETS $Q_2$ to $Q_6$ should be made sufficiently small. Here, it is not desirable from the design of an integrated circuit to make the size of the MOSs in the respective logic blocks disposed in rows and columns different. Thus, it becomes necessary to reduce the resistance of all the MOSFETs $Q_2$ to $Q_6$ and to manufacture all the logic blocks with the same ratings.

According to the above method, however, the time required for completely discharging the capacitor $C_o$ cannot yet be precisely controlled. Hence, a malfunction may occur unless the third pulse CE is applied with a considerable time margin. Thus, the access time could not have been improved much.

SUMMARY OF THE INVENTION

Therefore, an object of this invention is to provide a logic circuit utilizing dynamic drive, having a short access time and being free from malfunctions.

Another object of this invention is to provide a NAND type decoder circuit utilizing dynamic drive, having a simple circuit structure and capable of high speed accessing.

According to an embodiment of this invention, in an MOS logic circuit of dynamic drive type of conventional structure, a MOSFET means for discharging a charge stored on a word line is connected to the source side of a MOSFET means for outputting the stored information, and is also applied with a voltage at its gate to ground the source of the output MOSFET means during a predetermined discharging period of a precharge capacitor in the non-selection mode from the precharge period. In the period of grounding the source of the output MOSFET means, the word line is also grounded so that there exists no possiblity of causing a malfunction and that an address pulse and an information output enabling pulse can be supplied in synchronism. Thus, the access time can be shortened.

The above and other objects, features and advantages of this invention will become apparent from the following description of the embodiments of the invention when taken in conjunction with the accompanying drawings.

DESCRIPTION OF THE PREFERRED EMBODIMENTS

Figure 1A:
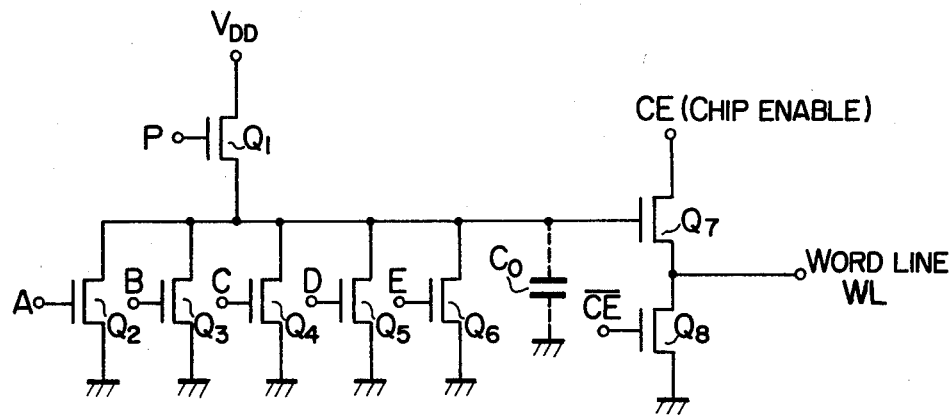
FIG. 1A is a circuit diagram of a 5-bit decoder showing an example of the prior art.

Throughout the figures, like reference numerals indicate like parts.

Prior to a detailed description of the embodiments of this invention, the basic structure of this invention will be described referring to FIG. 2. The circuit structure of FIG. 2 resembles that of the conventional NAND decoder circuit of FIG. 1. In the figure, letter G represents a logic circuit block corresponding to MOSFETs $Q_2$ to $Q_6$. In this circuit, when an input signal is applied to an input terminal $V_{in}$ of the logic circuit block G, the charge stored on a parasitic capacitor $C_o$ charged by the voltage $V_{DD}$ supplied through a precharging MOSFET $Q_{11}$ is discharged through that MOSFET of the logic circuit block to which the input signal is applied. During this period, called a sampling period, a signal $\phi'$ is applied to the gate of the MOSFET $Q_{31}$ and turns on the FET $Q_{31}$ to drop the output of the decoder circuit, i.e. to short-circuit the word line output WL to the ground level until MOSFET $Q_{31}$ becomes cut off. By this arrangement, even if a control pulse $\phi$ (e.g., a chip enable signal or a clock signal) is applied to the drain of a word line selecting MOSFET $Q_{21}$ immediately after the precharge of the capacitor $C_o$, the decoder does not cause a malfunction and an output signal is provided only after the signal $\phi'$ becomes lower than the threshold voltage $V_{th}$ of the MOSFET $Q_{31}$. Therefore, if the time constants of the applied signal $\phi'$ and the capacitor $C_o$ are determined to be the same, the decoder causes no malfunction and the speed-up of accessing becomes possible. Naturally, the FET $Q_{31}$ can discharge any charge stored on the word line WL (due to parasitic capacitance) in the address selection operation by a $\overline{CE}$ pulse applied to the gate thereof. Here, it will be noted that the $\overline{CE}$ pulse has a different timing from that of the applied signal $\phi'$.

Figure 3:
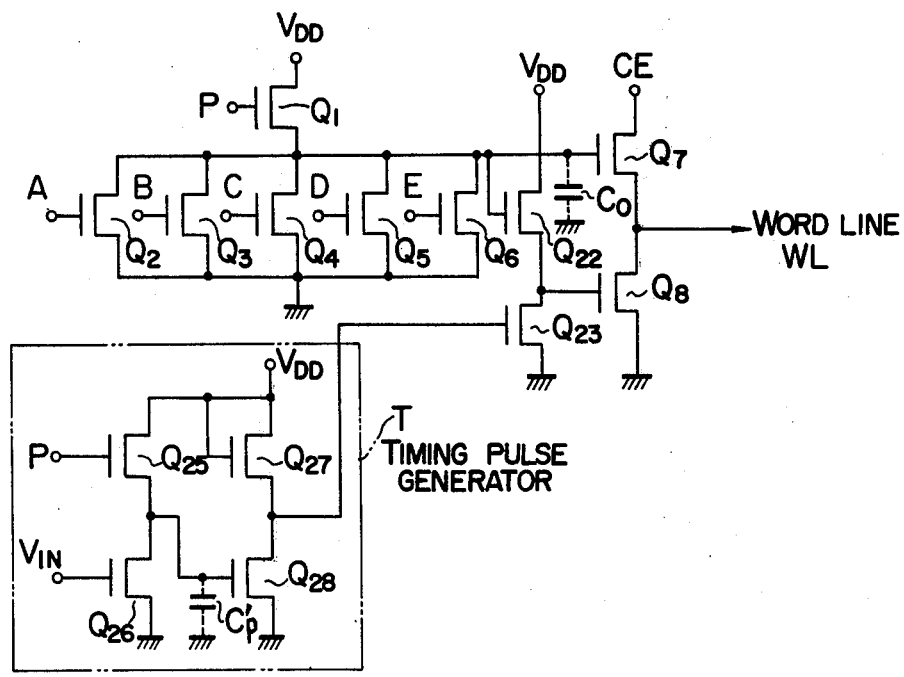
FIG. 3 is a circuit diagram of a 5-bit decoder according to an embodiment of this invention.

Next, an embodiment of this invention will be described referring to FIG. 3. In FIG. 3, a timing pulse generator circuit T is connected through an inverter consisting of MOSFETs $Q_{22}$ and $Q_{23}$ to the gate of a word line grounding MOSFET $Q_8$ for controlling the gate of the FET $Q_8$. The timing pulse generator circuit T includes a ratioless circuit consisting of a precharging MOSFET $Q_{25}$ having a drain applied with the voltage $V_{DD}$ and a MOSFET $Q_{26}$ receiving a signal of the same level as that of the address pulse, and an inverter consisting of MOSFETs $Q_{27}$ and $Q_{28}$ for inverting the output of the ratioless circuit.

In the operation of the address non-selective mode, the capacitor $C_o$ is charged by a precharging signal P and at the same time the MOSFETs $Q_{25}$ and $Q_{28}$ of the timing pulse generator circuit T are also turned on by a similar signal P. Then, the gate of the FET $Q_{23}$ is at ground level and this FET $Q_{23}$ is turned off. Here, the gate level of the FET $Q_8$ is at a high level by the source voltage $V_{DD}$ supplied through the FET $Q_{22}$, the gate of which is opened by the terminal voltage of the capacitor $C_o$, and hence the FET $Q_8$ is turned on. Thus, the word line WL is grounded to keep it at the ground (GND) level.

Next, an address signal is applied to at least one of the MOSFETs $Q_2$ to $Q_6$ of the logic block to drive the above-mentioned one MOSFET into the "on" state. At that time, the FET $Q_{26}$ is also turned on by a similar signal VIN to ground the output line. Thus, the charge stored in a parasitic capacitance $C_p'$ is discharged through the conducting FET $Q_{26}$ with a time constant determined by the on-resistance of MOSFET $Q_{26}$ and the capacitance $C'$. The gate of the FET $Q_{28}$ is at GND level and the FET $Q_{28}$ is turned off. Thus, the FET $Q_{23}$ is turned on. Here, however, since the gate of the FET $Q_8$ is applied with an operating voltage $V_{DD}$ through the FET $Q_{22}$ until the gate level of the FET $Q_{22}$ which is determined by the terminal voltage of the discharging capacitor $C_o$ becomes lower than the threshold voltage $V_{th}$ of the MOSFET $Q_{22}$, the FET $Q_8$ remains in the "on" state during the period when the output of the generator T is disabled and, simultaneously, the terminal voltage of capacitor $C_o$ is at the threshold voltage $V_{th}$ or greater. As a result, the word line WL remains to be grounded through the "on" state of the FET $Q_8$ and hence is held at the GND level. This will also be understood from the operation timing chart of FIG. 5.

On the other hand, when the capacitor $C_o$ is precharged after an address signal is applied to either of the gates of the MOSFETS $Q_2$ to $Q_6$, a common MOSFET may be connected between the sources of MOSFETs $Q_2$ to $Q_6$ and ground and be supplied with a pulse $\overline{P}$ at its gate. The timing pulse generator circuit T may be used in common to a plurality of decoder circuits with MOS FETs $Q_{22}$ and $Q_{23}$ as shown in FIG. 3.

As has been described above, the MOSFET $Q_8$ is held in the "on" state by the timing pulse generator circuit T which is constructed to have the same discharge time constant for capacitor $C_p'$ as that for capacitor $C_o$ in the logic circuit during its manufacturing process until the MOSFETs $Q_{26}$, $Q_2$ to $Q_6$ and $Q_7$ have all turned off consequently, MOSFET $Q_8$ holds the output level of the word line at the GND level, thus, preventing the word line from floating. Therefore, a malfunction never occurs in the present circuit. Further, even though such a timing pulse generator cicuit is provided, there is no need for increasing the transconductance $g_m$ of the MOSFETs which constitute the logic circuit. Thus, the degree of integration per chip does not decrease. Yet further, since it becomes unnecessary to await the application of the CE pulse until the full discharge of the capacitor, the timing of inputting or applying the CE pulse for the initiation of readout can be made earlier, thus providing a short access time.

Figure 4:
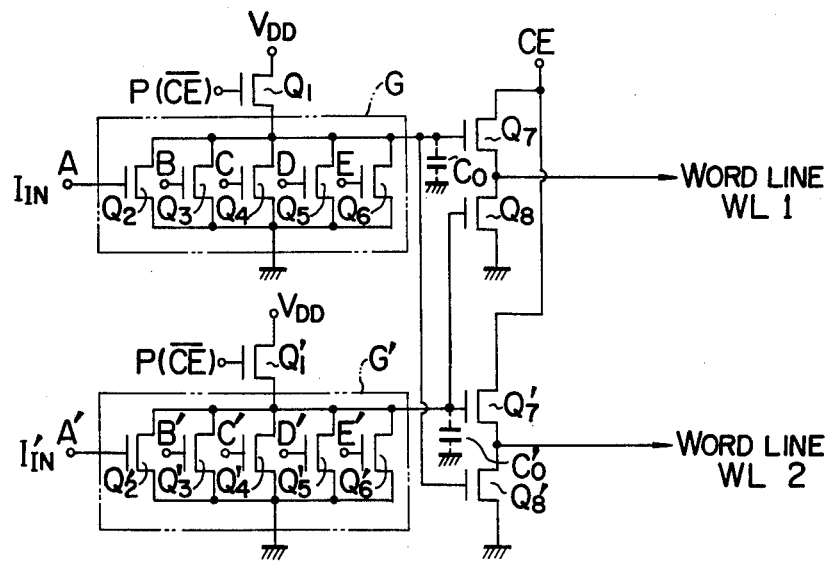
FIG. 4 is a circuit diagram of a plurality of decoders according to another embodiment of this invention.

FIG. 4 shows a circuit diagram of 5-bit decoders according to another embodiment of this invention, in which a pair of decoder circuits are coupled considering the fact that a memory circuit such as a RAM generally uses a plurality of similar decoder circuits consisting of logic gates.

Figure 1B:
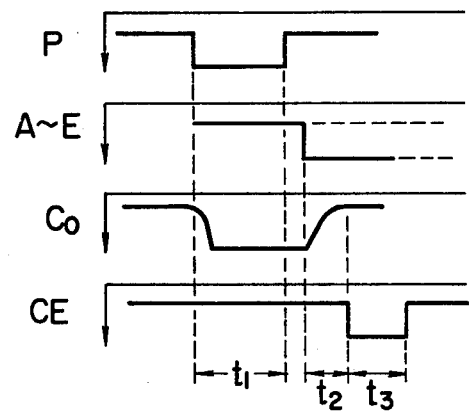
FIGS. 1B and 1C are timing chart diagrams for explaining the operation of the circuit of FIG. 1A.
Figure 1C:
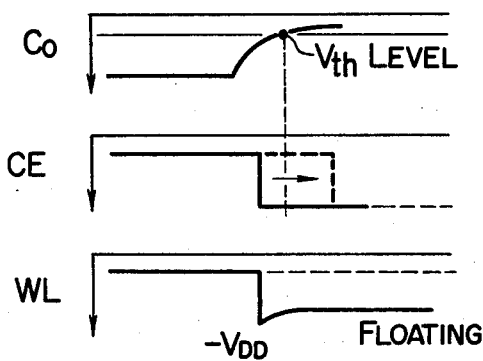
Figure 2:
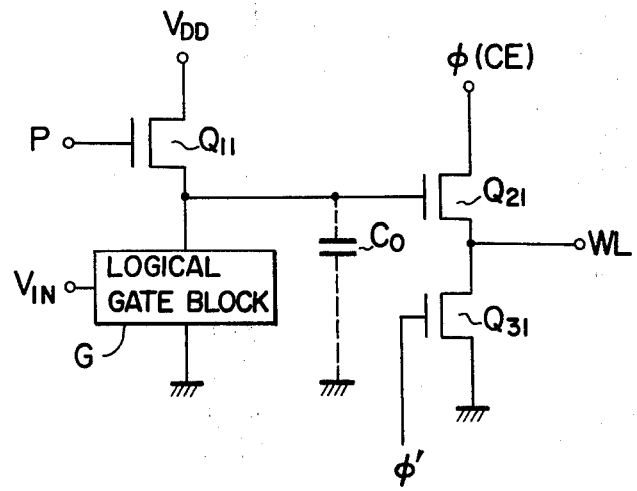
FIG. 2 is a basic logic circuit diagram for explaining the principle of this invention.

In the figure, a pair of decoder circuits having a structure similar to that of FIG. 1 are coupled in parallel. One end of each of capacitors $C_o$ and $C_o'$ connected, respectively, to the gate of grounding MOSFETs $Q_8'$ and $Q_8$ so as to apply the terminal voltages of the capacitors $C_o$ and $C_o'$ to the grounding MOSFETs for the word lines of the different decoder circuits.

Figure 5:
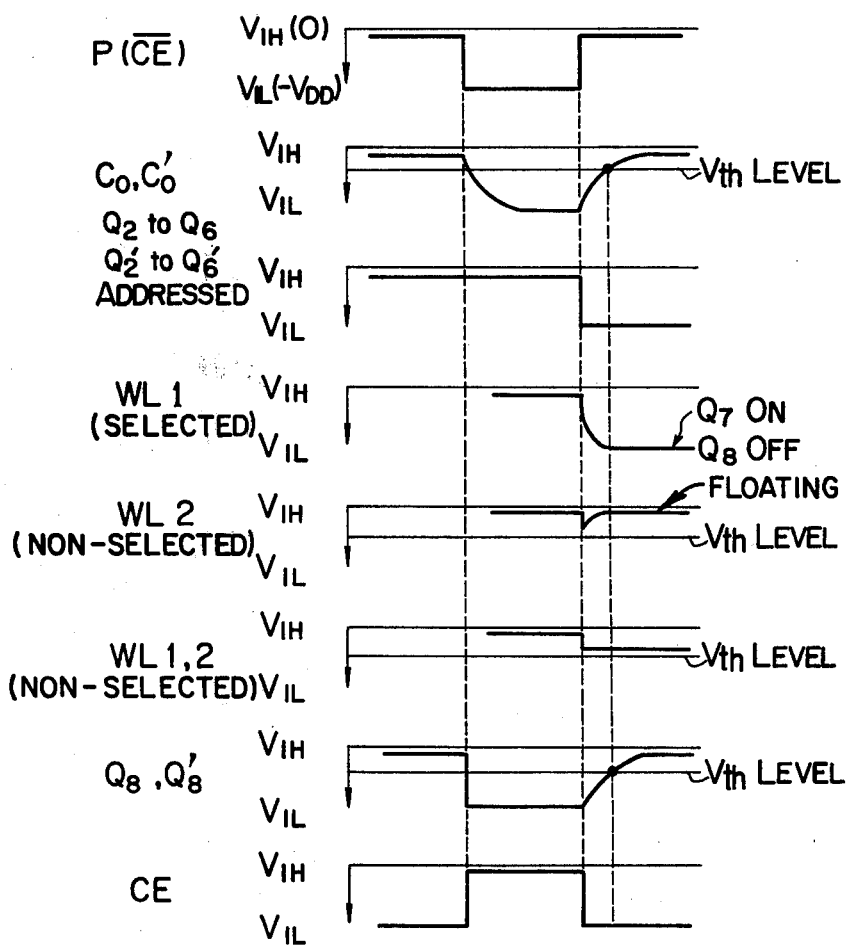
FIG. 5 is a timing chart diagram for explaining the operation of the circuit of FIG. 4.

The operation of this circuit will be described referring to the operational waveforms of FIG. 5. As is the case with the decoder of a dynamic drive type RAM, a first pulse called the precharging signal P is applied to the gates of the MOSFETs $Q_1$ and $Q_1'$ preceding the application of an address signal. Then, the capacitors $C_o$ and $C_o'$ are charged up at the supply voltage $V_{DD}$. Now, assuming that the word line WL1 of the upper MOS logic circuit is selected, i.e. all the MOSFETs $Q_2$ to $Q_6$ are turned off after precharging, no input is applied to the input terminal $I_{IN}$ of the gate circuit G and a second pulse called the address signal is supplied to the input terminal $I_{IN}'$ of the gate circuit G' for the non-selected word line WL2. At this time, the first pulse for the dynamic drive has disappeared from the gates of the MOSFETs $Q_1$ and $Q_1'$. Thus, the capacitor $C_o$ is held to be charged up while the other capacitor $C_o'$ is discharged through a logic gate FET applied with the second pulse A', B', . . . , or E' among the logic gate FETs $Q_2'$ to $Q_6'$. Then, the MOSFET $Q_8'$ is turned on by the charge stored on the capacitor $C_o$ to ground the source of the MOSFET $Q_7'$. The non-selected output word line WL2 is grounded in this manner and hence a signal of a logic "0" is supplied to the next stage MOS circuit by a third control pulse, e.g. a chip enable (CE) signal, applied to the drain of the MOSFET $Q_7'$ even when the capacitor $C_o'$ has not yet fully discharged and the malfunction is prevented.

The MOSFET $Q_8$ is kept in the "on" state until the charge stored on the capacitor $C_o'$ is discharged below the threshold voltage $V_{th}$, but thereafter it is turned off. Therefore, when a third pulse CE is supplied to the drain of the MOSFET $Q_7$ in this state, a signal of a logic "1" is obtained from the word line WL1 on the source side of the MOSFETs $Q_7$ to achieve the address selection.

Next, when neither of the word lines WL1 and WL2 of the MOS logic circuit is selected (non-selection mode), a second (address) pulse is supplied to the input terminals $I_{IN}$ and $I_{IN}'$ of the gate circuits G and G' and at least each one of the MOSFETs $Q_2$ to $Q_6$ and the MOSFETs $Q_2'$ to $Q_6'$ is turned on. Here, the first pulse has disappeared from the gates of the MOSFETs $Q_1$ and $Q_1'$. Then, the precharged capacitors $C_o$ and $C_o'$ are both discharged. The MOSFETs $Q_8$ and $Q_8'$ are both turned on by the charge stored on the capacitors $C_o$ and $C_o'$ similar to the MOSFETs $Q_7$ and $Q_7'$. These MOSFETs $Q_8$ and $Q_8'$ retain the "on" state until the terminal voltages of the capacitors $C_o'$ and $C_o$ decrease below the respective threshold voltages $V_{th}$. Thus, the MOSFETs $Q_8$ and $Q_8'$ are turned on, to ground the word lines WL1 and WL2 of the MOSFETs $Q_7$ and $Q_7'$ until the MOSFETs $Q_7$ and $Q_7'$ have been turned off. Thus, a third pulse CE may be applied to the drains of the MOSFETs $Q_7$ and $Q_7'$ even during the discharging period. In this case, signals of logic "O" are obtained on the respective word lines. Thus, the MOS circuit of the next stage never causes malfunction.

Further, in the circuit of FIG. 4, the MOSFETs $Q_8$ and $Q_8'$ for grounding the word lines can be driven by the use of the charge stored on the capacitors $C_o'$ and $C_o$ of the other part of the pair of decoders. Therefore, the prescribed objects can be achieved only by simple connections without complicating the circuit structure.

It will be apparent that the concept of the present invention can be applied to the read only memories (ROM) as well as to the RAMs.

In the above description, by way of example, MOSFETs are used as one kind of metal-insulator-semiconductor MISFETs. Therefore it should be understood that this invention is applicable to the case of using MISFET components other than MOS components.

What is claimed is:

1. An MIS decoder circuit arrangement of the dynamic drive type including at least a pair of decoder circuits, each decoder circuit comprising a dynamic ratioless circuit including a first MISFET for charging a predetermined capacitor by the application of a precharge pulse to the gate thereof, a MISFET gate circuit for discharging said capacitor by the application of an address pulse in the non-selection mode, a second MISFET receiving a third pulse and the terminal voltage of said capacitor at the drain and the gate thereof, respectively, for providing an output from the source thereof, and a third MISFET having a drain connected to the source of said second MISFET and a gate applied with a voltage controlled by the terminal voltage of the capacitor for grounding the source of said second MISFET, the terminal voltages of said capacitors in the respective decoder circuits being supplied to the gates of the third MISFETs of different decoder circuits.

2. A metal-insulator-semiconductor (MIS) decoder comprising:
first MIS means coupled to an operating voltage and being turned on by a first pulse and precharging a first capacitor with current flowing therethrough;
second MIS means coupled to a reference potential for providing a discharge path for the precharge of said capacitor by a second pulse in a non-selection mode;
third MIS means having a source, a drain and a gate, said gate and drain being applied with the output of said capacitor and a third pulse respectively, and said source providing an output of the decoder in selection and non-selection modes, said third pulse being applied simultaneously with the application of said second pulse;
fourth MIS means connected between the source of said third MIS means and the reference potential and having a gate applied with a voltage signal to hold the source of said third MIS means at the reference potential; and
means, responsive to said first pulse and said second pulse, for providing a pulse signal having a pulse width equal to that of the first pulse plus a discharge time constant determined by the maximum on-resistance of said second MIS means completing the discharge path and the capacitance of said first capacitor upon application of said first pulse, and said pulse signal being applied to the gate of said fourth MIS means as said voltage signal.

3. The MIS decoder according to claim 2, wherein said voltage signal providing means comprises
a timing pulse generator comprising a ratioless circuit including
a first metal-insulator-semicondutor field-effect transistor (MISFET) for enabling the precharge of a second capacitor, having the same characteristics as said first capacitor, by said first pulse,
a second MISFET responsive to said second pulse for discharging the precharge of said second capacitor in nonselection mode, and
an MIS inverter for inverting the output of said ratioless circuit,
a third MISFET responsive to the output of the MIS inverter for holding the gate of said fourth MIS means at the reference potential to render it inoperative, and
a fourth MISFET connected between said third MISFET and the operating voltage and responsive to the terminal voltage of said first capacitor for allowing the coupling between said third MISFET and the operating voltage, the node between said third and fourth MISFETs being connected to the gate of said fourth MIS means and providing a pulse signal as the output of said voltage signal providing means.

4. The MIS decoder according to claim 2, wherein said first and second MIS means and said third and fourth MIS means constitute dynamic ratioless circuits, respectively.

5. An MIS decode circuit of the dynamic drive type including at least first and second decoders, each decoder comprising:
a first MISFET turned on by a first pulse and precharging a parasitic capacitor by current flowing therethrough;
an MIS gate circuit rendered inoperative in a selection mode and operative by a second pulse in a non-selection mode to produce a discharge path for the precharge of said parasitic capacitor;
a second MISFET having a drain coupled to a third pulse, a gate connected to an output terminal of said parasitic capacitor, and a source from which the output of the decoder is derived in selection and non-selection modes, said third pulse being applied synchronously with said second pulse;
a third MISFET series-connected between the source of said second MISFET and ground and having a gate connected to receive a control voltage for grounding the source of said second MISFET by the applied control voltage; and
the output terminals of the parasitic capacitors of said first and second decoders being cross-coupled to the gates of their third MISFETs, thereby applying the terminal voltage of the parasitic capacitor of one of said first and second decoders as the control voltage for the other of said first and second decoders.

6. The MIS decode circuit according to claim 5, wherein said first, second, and third pulses are a precharge pulse, an address pulse and a control signal, such as a chip enable pulse, respectively, the source output of said second MISFET is a word line output, and the MISFET circuit of each decoder is a dynamic ratioless circuit.

7. A MIS decoder circuit arrangement utilizing the charging and discharging of a capacitor comprising:
a charging circuit for charging said capacitor;
an output circuit made up of series connected first and second MISFETs having their drain-to-source paths connected in series between an enable signal input terminal and a reference potential terminal, the output of said decoder circuit arrangement being derived from the interconnection point of said first and second MISFETs, the gate of said first MISFET being connected to said capacitor, and the gate of said second MISFET being coupled to receive a control signal;
a discharging circuit connected in parallel with said capacitor and being activated by a discharge signal so as to discharge said capacitor; and
means, coupled to the gate of said second MISFET, for supplying thereto a control signal which causes said second MISFET to conduct, said control signal being such that said second MISFET is rendered conductive for a period of time equal to the duration of said enable signal plus a prescribed time constant corresponding to the product of the maximum on-resistance of said discharging circuit and the capacitance of said capacitor, whereby the voltage at the output of said decoder circuit arrangement is prevented from floating.

* * * * *